United States Patent
Han et al.

(10) Patent No.: US 11,659,338 B2
(45) Date of Patent: May 23, 2023

(54) ULTRASONIC GENERATOR, METHOD OF MANUFACTURING THE SAME, DISPLAY PANEL AND SCREEN SOUND PRODUCING SYSTEM

(71) Applicant: BOE TECHNOLOGY GROUP CO., LTD., Beijing (CN)

(72) Inventors: Yanling Han, Beijing (CN); Haisheng Wang, Beijing (CN); Xiaoliang Ding, Beijing (CN); Yingming Liu, Beijing (CN); Pengpeng Wang, Beijing (CN); Chihjen Cheng, Beijing (CN); Ping Zhang, Beijing (CN); Xueyou Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 572 days.

(21) Appl. No.: 16/640,148

(22) PCT Filed: Jul. 19, 2019

(86) PCT No.: PCT/CN2019/096789
§ 371 (c)(1),
(2) Date: Feb. 19, 2020

(87) PCT Pub. No.: WO2020/024815
PCT Pub. Date: Feb. 6, 2020

(65) Prior Publication Data
US 2020/0171540 A1  Jun. 4, 2020

(30) Foreign Application Priority Data
Aug. 1, 2018 (CN) .................. 201810864137.X

(51) Int. Cl.
*B06B 1/06* (2006.01)
*H04R 17/00* (2006.01)
(Continued)

(52) U.S. Cl.
CPC .......... *H04R 17/005* (2013.01); *H04R 31/00* (2013.01); *B06B 1/0292* (2013.01); *B06B 1/0629* (2013.01);
(Continued)

(58) Field of Classification Search
CPC .......................... B06B 1/0292; B06B 1/0629
See application file for complete search history.

(56) References Cited

U.S. PATENT DOCUMENTS 7,037,746 B1 * 5/2006 Smith ................... B06B 1/0292
438/53
2007/0071261 A1   3/2007 Matsuzawa
(Continued)

FOREIGN PATENT DOCUMENTS

CN    1942020 A    4/2007
CN    1946248 A    4/2007
(Continued)

OTHER PUBLICATIONS

First Office Action and English language translation, CN Application No. 201810864137.X, dated Sep. 27, 2019, 28 pp.
(Continued)

*Primary Examiner* — Bryan P Gordon
(74) *Attorney, Agent, or Firm* — Myers Bigel, P.A.

(57) ABSTRACT

An ultrasonic generator includes a substrate, a lower electrode on the substrate, an upper electrode on the lower electrode, and an ultrasonic generation unit between the lower electrode and the upper electrode. The ultrasonic generation unit includes a vibration chamber and an ultrasonic generation layer on the vibration chamber. The ultrasonic generation layer is configured to propel a surrounding medium to vibrate to generate ultrasonic waves in response to a voltage difference between the upper electrode and the lower electrode.

10 Claims, 9 Drawing Sheets

(51) Int. Cl.
*H04R 31/00* (2006.01)
*B06B 1/02* (2006.01)

(52) U.S. Cl.
CPC .... *H04R 2201/401* (2013.01); *H04R 2217/03* (2013.01); *H04R 2499/15* (2013.01); *H10K 59/00* (2023.02)

(56) References Cited

U.S. PATENT DOCUMENTS

| | | | |
|---|---|---|---|
| 2007/0154035 A1 | 7/2007 | Fukui | |
| 2007/0154036 A1 | 7/2007 | Matsuzawa | |
| 2007/0169555 A1 | 7/2007 | Gao et al. | |
| 2009/0058228 A1 | 3/2009 | Wakabayashi et al. | |
| 2014/0010052 A1* | 1/2014 | Torashima | B06B 1/0292 367/181 |
| 2014/0369514 A1* | 12/2014 | Baym | H04R 5/04 381/387 |
| 2015/0135841 A1* | 5/2015 | Kato | B81B 3/0021 257/416 |
| 2017/0225196 A1 | 8/2017 | Rothberg et al. | |
| 2019/0095046 A1 | 3/2019 | Guo et al. | |
| 2020/0171540 A1 | 6/2020 | Han et al. | |

FOREIGN PATENT DOCUMENTS

| | | |
|---|---|---|
| CN | 101378605 A | 3/2009 |
| CN | 105413997 A | 3/2016 |
| CN | 105578368 | 5/2016 |
| CN | 107368227 A | 11/2017 |
| CN | 107589847 A | 1/2018 |
| CN | 108183163 A | 6/2018 |
| CN | 109068245 A | 12/2018 |
| JP | 2007-189691 A | 7/2007 |
| JP | 2015-212667 A | 11/2015 |

OTHER PUBLICATIONS

Second Office Action and English language translation, CN Application No. 201810864137.X, dated Jun. 12, 2020, 28 pp.

* cited by examiner

ULTRASONIC GENERATOR, METHOD OF MANUFACTURING THE SAME, DISPLAY PANEL AND SCREEN SOUND PRODUCING SYSTEM

RELATED APPLICATION

The present application is a 35 U.S.C. 371 national stage application of a PCT International Application No. PCT/CN2019/096789, filed on Jul. 19, 2019, which claims the benefit of Chinese Patent Application No. 201810864137.X, filed on Aug. 1, 2018, the entire disclosure of which is incorporated herein by reference.

FIELD

The present disclosure relates to a technology for generating a sound field and an image display technology, and particularly to an ultrasonic generator, a method of manufacturing the ultrasonic generator, a display panel comprising the ultrasonic generator, and a screen sound producing system.

BACKGROUND

With the development of ultra-thinness, narrow bezel, and even full-screen design for display devices, the space left for a sound producing device in a display device is getting smaller and smaller. Since typical sound producing devices are usually relatively large in size, and most of them have the process structure of a silicon-based MEMS (Micro-Electro-Mechanical System), it is difficult for them to achieve integrated design with display panels. In addition, for some special requirements, people may prefer a directional sound producing device, and prefer that the directional sound producing device can be integrated into a display panel, so that combination of directional sound production and display technology can be achieved.

SUMMARY

According to some embodiments of the present disclosure, there is provided an ultrasonic generator comprising: a substrate; a lower electrode on the substrate; an upper electrode on the lower electrode; and an ultrasonic generation unit between the lower electrode and the upper electrode. The ultrasonic generation unit comprises a vibration chamber and an ultrasonic generation layer on the vibration chamber. The ultrasonic generation layer is configured to propel a surrounding medium to vibrate to generate ultrasonic waves in response to a voltage difference between the upper electrode and the lower electrode.

In some embodiments, the ultrasonic generation unit is selected from the group consisting of a capacitive ultrasonic generation unit and a piezoelectric ultrasonic generation unit.

In some embodiments, the ultrasonic generation layer of the capacitive ultrasonic generation unit comprises: a silicon nitride layer comprising a plurality of etched holes; and a porous silicon layer between the silicon nitride layer and the upper electrode.

In some embodiments, the ultrasonic generation layer of the piezoelectric ultrasonic generation unit comprises: a silicon nitride layer comprising a plurality of etched holes; a porous silicon layer on the silicon nitride layer; and a piezoelectric film layer between the porous silicon layer and the upper electrode.

In some embodiments, the ultrasonic generator further comprises at least two sacrificial layer portions between the lower electrode and the ultrasonic generation layer. The at least two sacrificial layer portions define a groove therebetween, and the groove serves as the vibration chamber.

In some embodiments, the ultrasonic generator further comprises a first adhesive layer between the ultrasonic generation layer and the upper electrode; at least two sacrificial layer portions between the substrate and the ultrasonic generation layer; and one or more second adhesive layers, a respective one of the second adhesive layers being between a respective one of the at least two sacrificial layer portions and the ultrasonic generation layer. The at least two sacrificial layer portions define a groove therebetween, and the groove serves as the vibration chamber.

In some embodiments, the sacrificial layer portions and the substrate are formed integrally and made of the same material.

In some embodiments, the lower electrode is bonded to a bottom of the groove.

In some embodiments, the sacrificial layer portions comprise a metal material and function as the lower electrode.

According to some embodiments of the present disclosure, there is provided a display panel comprising a plurality of units arranged in an array. Each unit comprises a pixel unit and any one of the ultrasonic generators described above.

In some embodiments, the display panel comprises an organic light emitting diode display panel. Each unit further comprises: a first transistor; a second transistor, disposed in the same layer as the first transistor; and a first electrode of an organic light emitting diode, on the first transistor and electrically connected to the first transistor through a first via hole. The ultrasonic generator is on the second transistor, and a lower electrode of the ultrasonic generator is electrically connected to the second transistor through a second via hole.

In some embodiments, each unit further comprises: an organic light emitting layer of the organic light emitting diode, on the first electrode; and a second electrode of the organic light emitting diode, covering the organic light emitting layer and the ultrasonic generator. The second electrode functions as an upper electrode of the ultrasonic generator.

According to some embodiments of the present disclosure, there is provided a method of manufacturing an ultrasonic generator, comprising: providing a substrate; forming a lower electrode on the substrate; depositing a sacrificial layer on the lower electrode; forming an ultrasonic generation layer on the sacrificial layer, wherein the ultrasonic generation layer comprises air holes; patterning the sacrificial layer through the air holes to form a vibration chamber of the ultrasonic generator; and forming an upper electrode on the ultrasonic generation layer.

In some embodiments, said patterning the sacrificial layer through the air holes comprises: exposing the sacrificial layer to a reagent through the air holes to etch the sacrificial layer.

In some embodiments, said forming an ultrasonic generation layer on the sacrificial layer comprises: depositing a silicon nitride layer on the sacrificial layer; forming a silicon nitride layer comprising a plurality of etched holes by etching the silicon nitride layer; and forming a porous silicon layer on the silicon nitride layer.

In some embodiments, after patterning the sacrificial layer through the air holes, the method further comprises: forming a piezoelectric film layer on the porous silicon layer. Forming an upper electrode on the ultrasonic generation layer comprises: forming the upper electrode on the piezoelectric film layer.

According to some embodiments of the present disclosure, there is provided a method of manufacturing an ultrasonic generator, comprising: providing a substrate; forming at least two sacrificial layer portions on the substrate, wherein the at least two sacrificial layer portions define a groove therebetween, and the groove serves as a vibration chamber of the ultrasonic generator; bonding an ultrasonic generation layer onto the at least two sacrificial layer portions using a second adhesive layer; and bonding an upper electrode onto the ultrasonic generation layer using a first adhesive layer.

In some embodiments, said forming at least two sacrificial layer portions on the substrate comprises: etching a side of the substrate close to the ultrasonic generation layer to form the at least two sacrificial layer portions. Prior to bonding an ultrasonic generation layer onto the at least two sacrificial layer portions using a second adhesive layer, the method further comprises: bonding a lower electrode to a bottom of the groove.

In some embodiments, said forming at least two sacrificial layer portions on the substrate comprises: depositing a metal layer on the substrate; and etching the metal layer to form the at least two sacrificial layer portions. The at least two sacrificial layer portions serve as a lower electrode of the ultrasonic generator.

According to some embodiments of the present disclosure, there is provided a screen sound producing system, comprising: a screen sound producing device comprising a plurality of ultrasonic generators as described above which are arranged in an array; and a sound production controller configured to control the screen sound producing device to produce sound according to an input audio signal.

BRIEF DESCRIPTION OF THE DRAWINGS

The above and/or additional aspects and advantages of the present disclosure will become apparent and easily understood from the following description of the embodiments in conjunction with the accompanying drawings, in which.

DETAILED DESCRIPTION

Figure 1:
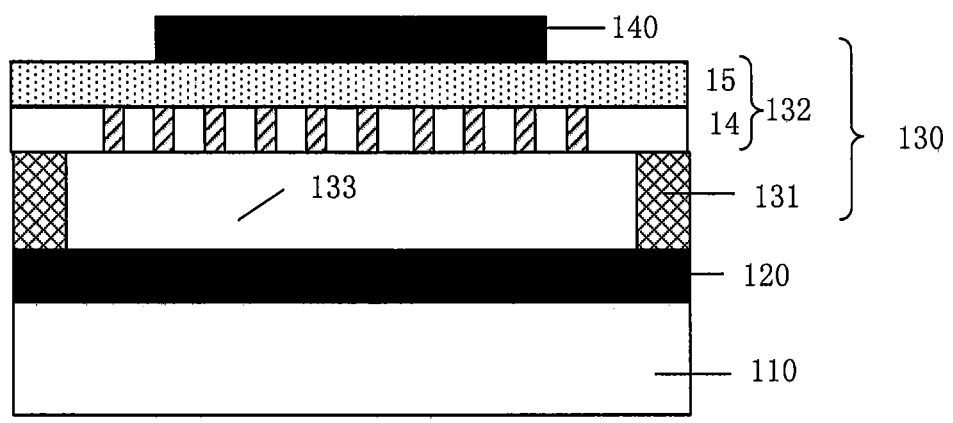
FIG. 1 is a schematic view illustrating a sectional structure of an ultrasonic generator according to an embodiment of the present disclosure.

It will be understood that, although the terms first, second, third, etc. may be used herein to describe various elements, components, regions, layers and/or portions, these elements, components, regions, layers and/or portions should not be limited by these terms. These terms are only used to distinguish one element, component, region, layer or portion from another region, layer or portion. Therefore, a first element, component, region, layer or portion discussed below may be referred to as a second element, component, region, layer or portion without departing from the teachings of the present disclosure.

Spatially relative terms such as "under", "beneath", "lower", "below", "above", "upper", etc. may be used herein to describe the relationships between one element or feature and other element(s) or feature(s) as illustrated in the drawings for the convenience of description. It will be understood that these spatially relative terms are intended to encompass different orientations of a device in use or operation in addition to the orientation depicted in the drawings. For example, if a device in the drawings is turned over, elements described as being "under other elements or features", "beneath other elements or features" or "below other elements or features" would be oriented as being "above other elements or features". Thus, the exemplary terms "under" and "below" may encompass two orientations of being above and being below. Terms such as "prior to" or "before" and "after" or "next" may similarly be used, for example, to indicate the order in which light passes through elements. The device may be oriented otherwise (rotated by 90 degrees or at other orientations) and the spatially relative descriptors used herein are interpreted accordingly. In addition, it will also be understood that when a layer is referred to as being "between two layers", it may be the unique layer between the two layers, or one or more intermediate layers may also be present.

The terms used herein are for the purpose of describing specific embodiments only and are not intended to limit the present disclosure. As used herein, singular forms "a" "an" and "the" are intended to include plural forms as well, unless indicated otherwise clearly in the context. It will be further understood that the terms "include" and/or "comprise" when used in this specification specify the presence of said feature, integral, step, operation, element and/or component, but do not exclude the presence or addition of one or more other features, integrals, steps, operations, elements, components and/or groups thereof. As used herein, the term "and/or" includes any and all combinations of one or more of the associated listed items.

It will be understood that when an element or layer is referred to as being "on another element or layer", "connected to another element or layer", "coupled to another element or layer" or "adjacent to another element or layer", it may be directly on another element or layer, directly connected to another element or layer, directly coupled to another element or layer, or directly adjacent to another element or layer, or there may be an intermediate element or layer. Conversely, when an element is referred to as being "directly on another element or layer", "directly connected to another element or layer", "directly coupled to another element or layer" or "directly adjacent to another element or layer", there is no intermediate element or layer. However, under no circumstances should "on" or "directly on" be construed as requiring one layer to completely cover the layers below.

Embodiments of the present disclosure are described herein with reference to schematic illustrations (and intermediate structures) of idealized embodiments of the present disclosure. Because of this, variations in the illustrated shapes should be expected, for example, as a result of manufacturing techniques and/or tolerances. Therefore, the embodiments of the present disclosure should not be interpreted as being limited to the specific shapes of the regions illustrated herein, but should include, for example, shape deviations due to manufacturing. Thus, the regions illustrated in the drawings are essentially schematic, and the shapes thereof are not intended to illustrate the actual shapes of regions of a device and are not intended to limit the scope of the present disclosure.

Unless otherwise defined, all the terms (including technical and scientific terms) used herein have the same meanings as commonly understood by a person having an ordinary skill in the art to which the present disclosure pertains. It will be further understood that terms such as those defined in commonly used dictionaries should be interpreted to have meanings consistent with their meanings in the related fields and/or the context of this specification, and will not be interpreted in an idealized or excessively formal sense, unless explicitly defined herein. In order to combine a sound producing device with display technology, some manufacturers of display devices have tried to use a screen to produce sound. For example, in an organic light emitting diode (OLED) display, the entire OLED screen is used as a diaphragm, so that the OLED screen is capable of producing sound. However, during the sound producing process of this design, the display screen vibrates as a whole, and in order to facilitate driving of screen vibration, the driving motor needs to be designed as being in the middle of the screen, which makes the amplitude in the middle of the screen larger than that at the edges. As a result, display of the entire image is affected.

In addition, such a design of using the display panel as a diaphragm can only be applied to an OLED panel and cannot be applied to a liquid crystal display (LCD) panel. This is because the OLED panel can provide good feedback to sound due to its flexible characteristic. At the same time, the OLED panel is relatively light and thin, which can be easily driven to achieve sound production by vibration. However, the liquid crystal display panel has a complicated structure, and the material thereof is usually relatively hard, which is not conducive to effective reproduction of sound vibration.

In addition, such a sound producing device is usually relatively large in size, and is not suitable for use in battery-powered mobile terminals such as a mobile phone, tablet computer, and the like.

In some embodiments of the present disclosure, an ultrasonic generator is proposed. The ultrasonic generator is small in size and can be disposed within each pixel-level unit of a display panel, so that combination of screen sound production and display technology can be achieved. In addition, the ultrasonic generator can realize directional sound production, and thus achieve directional audio and private listening.

Hereinafter, embodiments of the present disclosure will be described in detail with reference to the accompanying drawings.

FIG. 1 is a schematic view illustrating a sectional structure of an ultrasonic generator 100A according to an embodiment of the present disclosure.

As shown in FIG. 1, the ultrasonic generator 100A comprises a substrate 110, a lower electrode 120 on the substrate 110, an upper electrode 140 on the lower electrode 120, and an ultrasonic generation unit 130 between the lower electrode 120 and the upper electrode 140. The ultrasonic generation unit 130 comprises a vibration chamber 133 and an ultrasonic generation layer 132 disposed on the vibration chamber 133. The ultrasonic generation layer 132 is configured to, by applying voltages to the upper electrode 140 and the lower electrode 120 respectively, propel a surrounding medium (for example, air) to vibrate to generate ultrasonic waves under an operating voltage formed between the two electrodes.

The ultrasonic generation unit 130 may be implemented by referring to the principle of an ultrasonic sensor in the related art. In practice, a structure similar to an ultrasonic sensor may be employed. However, the ultrasonic sensor in operation usually needs to emit ultrasonic waves and receive reflected echoes, and in the present application, as a part of the ultrasonic generator, the ultrasonic generation unit 130 in operation only needs to emit ultrasonic waves and does not need to receive echoes. In some embodiments, in order to reduce the resistance when the ultrasonic generation layer 132 vibrates, the vibration chamber 133 may be set as a vacuum chamber. Alternatively, the amount of air in the vibration chamber 133 is reduced as much as possible to bring it close to a vacuum.

The ultrasonic generator 100A is a capacitive ultrasonic generator. Accordingly, the ultrasonic generation layer 132 employs a vibrating film layer in a capacitive ultrasonic sensor. As shown in FIG. 1, the ultrasonic generation layer 132 comprises a silicon nitride layer 14 having a plurality of etched holes, and a porous silicon layer 15 between the silicon nitride layer 14 and the upper electrode 140. On the one hand, the silicon nitride layer 14 and the porous silicon layer 15 are beneficial to the formation of the vibration chamber 133 (this will be described in detail later), and on the other hand, they can also serve as vibrating film layers of a capacitive ultrasonic generation unit to realize reuse of functions.

The size of the ultrasonic generation unit 130 may be at pixel level or quasi-pixel level, or may be larger than the pixel level. The smaller size means that more ultrasonic generation units can be arranged in the same area. Therefore, in order to obtain the same sound intensity, the ultrasonic power of each ultrasonic generation unit having a smaller size may be relatively reduced. Moreover, the strength requirement of each ultrasonic generation unit on the vibrating film layer may be relatively reduced, and the driving voltage may also be relatively lower. In addition, more ultrasonic generation units also mean that the distribution of the output sound field can be more precisely controlled through appropriate control methods.

Figure 2:
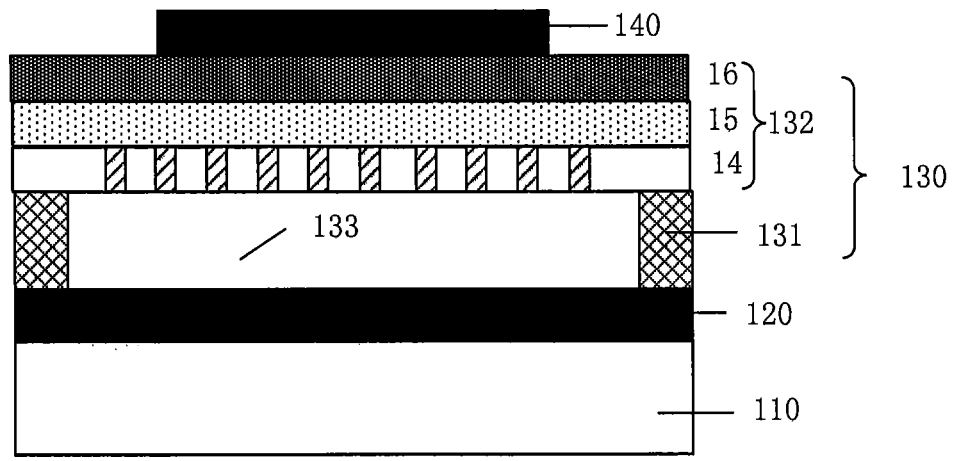
FIG. 2 is a schematic view illustrating a sectional structure of an ultrasonic generator according to an embodiment of the present disclosure.

FIG. 2 is a schematic view illustrating a sectional structure of an ultrasonic generator 100B according to an embodiment of the present disclosure. The ultrasonic generator 100B is a piezoelectric ultrasonic generator. Accordingly, the ultrasonic generation layer 132 employs a piezoelectric film layer in a piezoelectric ultrasonic sensor. Different from the ultrasonic generator 100A, the ultrasonic generation layer 132 of the piezoelectric ultrasonic generator 100B shown in FIG. 2 further comprises, in addition to the silicon nitride layer 14 and the porous silicon layer 15, a piezoelectric film layer 16 between the porous silicon layer 15 and the upper electrode 140.

Figure 3:
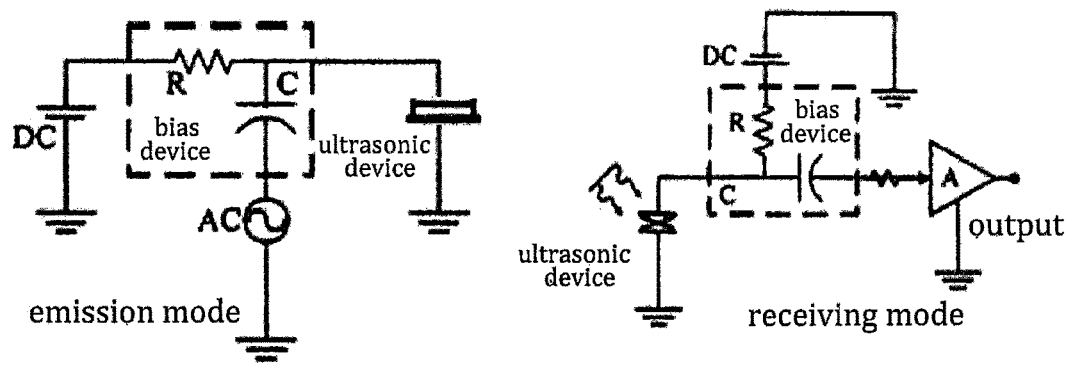
FIG. 3 is a schematic view illustrating the operating principle of an ultrasonic sensor.

FIG. 3 is a schematic view illustrating the operating principle of an ultrasonic sensor. For a capacitive ultrasonic generator, in the emission mode, in case a DC voltage is applied between the upper and lower electrodes of the device, the electrostatic force will pull the ultrasonic generation layer 132 (vibrating film) to the lower electrode, and the residual tension in the ultrasonic generation layer 132 is offset by this pulling force. If an AC voltage with a frequency same as the mechanical resonance frequency is applied to the ultrasonic generation layer 132, the ultrasonic generation layer 132 will be displaced and oscillated and propel the surrounding medium to do work to generate a large amount of ultrasonic waves. In the receiving mode, an appropriate DC bias voltage is applied to the ultrasonic generation layer 132. When the ultrasonic generation layer 132 receives ultrasonic waves, the ultrasonic generation layer 132 will flex, and the polar plate capacitance will change to generate an alternating current, which is subjected to transconductance amplification and subsequent processing to generate an output voltage, realizing conversion of acoustic energy to electric energy. For a piezoelectric ultrasonic generator, in the emission mode, using the inverse piezoelectric effect, a voltage pulse signal is applied between the upper and lower electrodes so that the piezoelectric film layer 16 is deformed, thereby propelling the surrounding medium to vibrate to generate ultrasonic waves. In the receiving mode, using the forward piezoelectric effect, the piezoelectric film layer 16 receives ultrasonic waves so that the piezoelectric film layer 16 is deformed, thereby generating a high-frequency voltage and amplifying the output.

Specifically, when the ultrasonic generation unit 130 is a capacitive ultrasonic generation unit, the ultrasonic generation layer 132 is displaced and oscillated under the effect of an alternating voltage, and propels the surrounding medium to vibrate to generate ultrasonic waves. When the ultrasonic generation unit 130 is a piezoelectric ultrasonic generation unit, the ultrasonic generation layer 132 is deformed under the effect of a pulse voltage, and propels the surrounding medium to vibrate to generate ultrasonic waves.

Referring back to FIGS. 1 and 2, the ultrasonic generators 100A and 100B each further comprises two sacrificial layer portions 131. The two sacrificial layer portions 131 are between the lower electrode 120 and the ultrasonic generation layer 132, and the two sacrificial layer portions 131 define a groove therebetween that serves as a vibration chamber 133. In some embodiments, the sacrificial layer portions 131 may include a silicon dioxide material, and a groove obtained by etching the silicon dioxide layer serves as a vibration chamber 133.

Figure 4A:
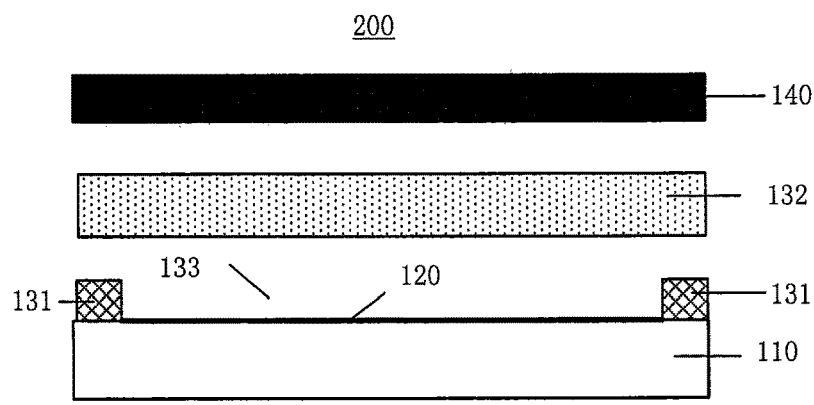
FIG. 4A is an exploded view illustrating a sectional structure of an ultrasonic generator according to an embodiment of the present disclosure.
Figure 4B:
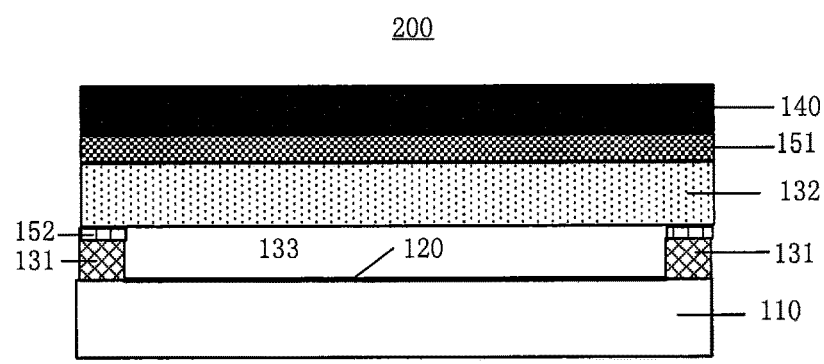
FIG. 4B is a schematic view illustrating a sectional structure of an ultrasonic generator according to an embodiment of the present disclosure.

FIG. 4A is an exploded view illustrating a sectional structure of an ultrasonic generator 200 according to an embodiment of the present disclosure (in which some elements are omitted for clarity), and FIG. 4B illustrates a sectional structure of the ultrasonic generator 200 in more detail.

The ultrasonic generator 200 has substantially the same configuration as the ultrasonic generators 100A and 100B shown in FIGS. 1 and 2, and therefore, the same components are denoted by the same reference numerals. For example, the ultrasonic generator 200 similarly comprises a substrate 110, a lower electrode 120, an upper electrode 140, and an ultrasonic generation unit 130 between the lower electrode 120 and the upper electrode 140. The ultrasonic generation unit 130 comprises a vibration chamber 133 and an ultrasonic generation layer 132 disposed on the vibration chamber 133. A groove between the two sacrificial layer portions 131 serves as the vibration chamber 133. In addition, in the ultrasonic generator 200, the ultrasonic generation layer 132 may employ a vibrating film layer in a capacitive ultrasonic sensor or a piezoelectric film layer in a piezoelectric ultrasonic sensor.

The difference between the ultrasonic generator 200 and the ultrasonic generators 100A and 100B mainly lies in the following two aspects: one is the positions and implementations of the lower electrode 120 and the sacrificial layer portions 131, and the other is the way of combining the ultrasonic generation layer 132 and the second electrode 140 with the substrate 110.

In the ultrasonic generator 200, the sacrificial layer portions 131 and the substrate 110 are integrally formed and made of the same material. In other words, the sacrificial layer portions 131 are parts of the substrate 110 and are obtained by etching a side of the substrate 110 close to the ultrasonic generation layer 132. The specific formation process will be described in detail later, and will not be repeated here. It is to be noted that, in order to distinguish the part of the substrate 110 that serves as the sacrificial layer (that is, the sacrificial layer portions 131), a different reference numeral from the substrate 110 is used for illustration, but they are essentially different parts of an entirety and made of the same material. The substrate 110 may employ a rigid glass substrate to ensure the stability of the chamber and thus the stability of sound production. Of course, substrates made of other materials may also be used, such as plastics and resins with corresponding hardness and transparency. The substrate 100 is etched to obtain the sacrificial layer portions 131 on two sides of the substrate 110 and a groove between the sacrificial layer portions 131. The groove serves as a vibration chamber 133. In this case, the lower electrode 120 is bonded (e.g. adhered by an adhesive layer) to the bottom of the groove formed by etching the substrate 110. The lower electrode 120 and the upper electrode 140 are used to provide an operating voltage to the ultrasonic generation layer 132 of the ultrasonic generator 100.

As shown in FIG. 4B, the ultrasonic generator 200 further comprises a first adhesive layer 151 and one or more second adhesive layers 152. The first adhesive layer 151 is between the ultrasonic generation layer 132 and the upper electrode 140. A respective one of the second adhesive layers 152 is between a respective one of the two sacrificial layer portions 131 and the ultrasonic generation layer 132. The first adhesive layer 151 is used to adhere the second electrode 140 to the ultrasonic generation layer 132, and the second adhesive layer 152 is used to adhere the ultrasonic generation layer 132 to the sacrificial layer portion 131. In some embodiments, the first adhesive layer 151 may include a conductive adhesive layer, and the second adhesive layer 152 may include an insulating adhesive layer.

Figure 5A:
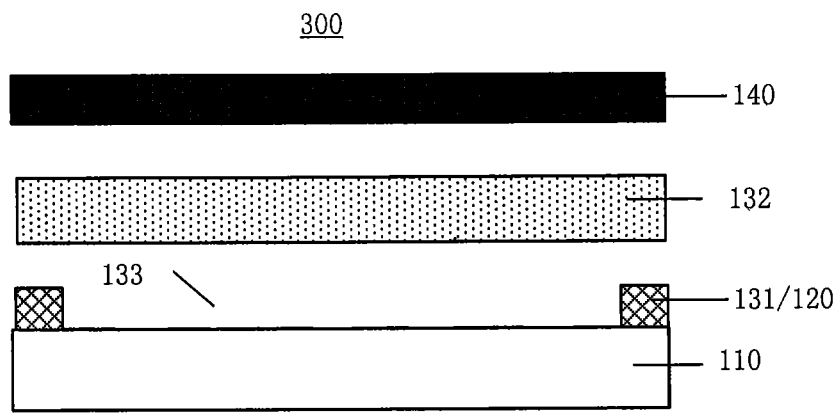
FIG. 5A is an exploded view illustrating a sectional structure of an ultrasonic generator according to an embodiment of the present disclosure.
Figure 5B:
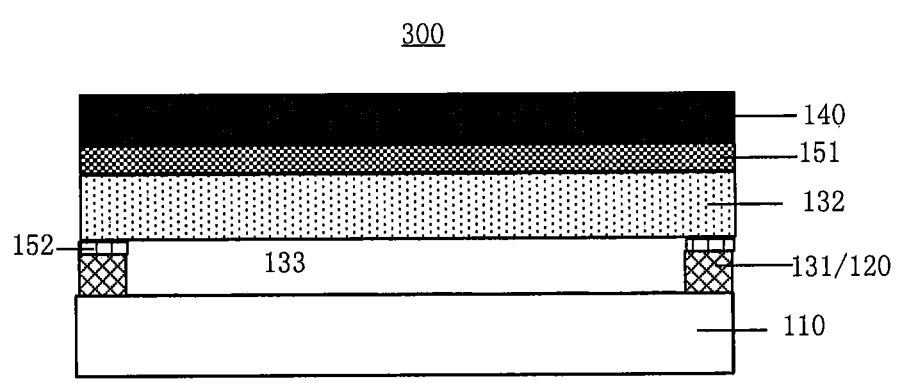
FIG. 5B is a schematic view illustrating a sectional structure of an ultrasonic generator according to an embodiment of the present disclosure.

FIG. 5A is an exploded view illustrating a sectional structure of an ultrasonic generator 300 according to an embodiment of the present disclosure (in which some elements are omitted for clarity), and FIG. 5B illustrates a sectional structure of ultrasonic generator 300 in more detail.

The ultrasonic generator 300 has substantially the same configuration as the ultrasonic generator 200 shown in FIGS. 4A and 4B, and therefore, the same components are denoted by the same reference numerals.

The difference between the ultrasonic generator 300 and the ultrasonic generator 200 shown in FIGS. 4A and 4B mainly lies in the structure of the sacrificial layer 131. In the ultrasonic generator 300, the sacrificial layer portion 131 is an independent portion. That is, it is not integrally formed with the substrate 110. In some embodiments, the sacrificial layer portion 131 may be a structure obtained by etching a metal layer deposited on the substrate 110. In this case, the sacrificial layer portion 131 formed of a metal material may be used as the lower electrode 120. In other words, the sacrificial layer portion 131 can be used as a structure for forming the vibration chamber 133 on the one hand, and can also be used as the lower electrode 120 to realize the reuse of functions.

In order to achieve a better display effect when integrated with a display, the substrate 110, the upper electrode 140, the lower electrode 120, and the ultrasonic generation layer 132 may all be made of transparent materials. For example, the substrate 110 may be made of glass or other transparent plastics, resins, or the like. The upper electrode 140 and the lower electrode 120 may employ transparent electrodes. In this way, the ultrasonic generator according to the embodiment of the present disclosure can be set on the light exit side of a display screen without affecting display. At the same time, since it is set on the light exit side, ultrasonic waves emitted by the ultrasonic generator are less affected by other structures, so that it is easier to control the sound field. Of course, as an optional implementation, the ultrasonic generator according to the embodiment of the present disclosure may also have an opaque structure for use in scenarios other than integration with a display. Alternatively, it may also be disposed on the non-light exit side of a display screen.

Figure 6:
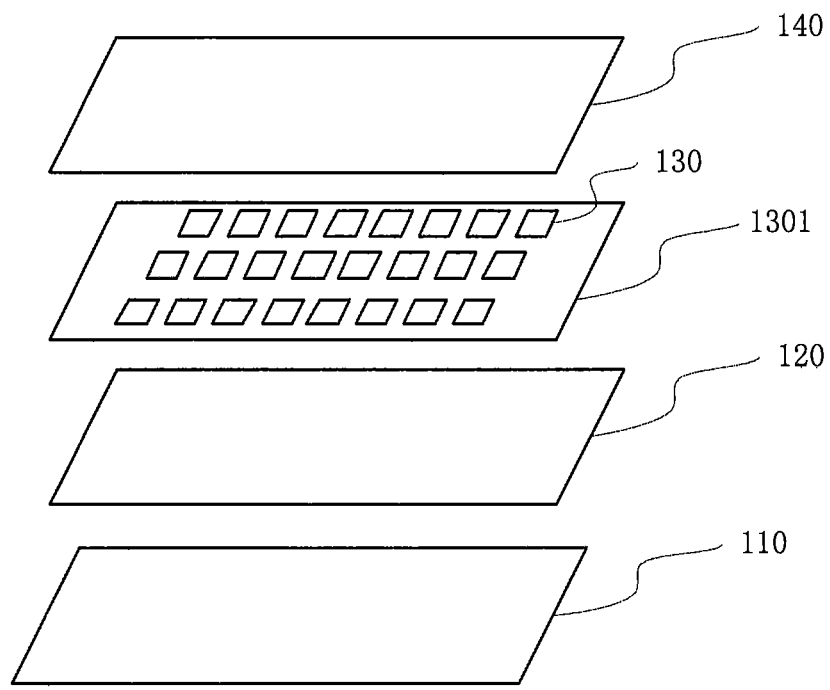
FIG. 6 is a schematic view of a screen sound producing device according to an embodiment of the present disclosure.

FIG. 6 is a schematic view of a screen sound producing device 400 according to an embodiment of the present disclosure.

Referring to FIG. 6, the screen sound producing device 400 comprises a plurality of ultrasonic generators arranged in an array. The ultrasonic generator may be an ultrasonic generator in any one of the foregoing embodiments. In the screen sound producing device 400, the ultrasonic generators may share the same substrate, the same lower electrode, and the same upper electrode. That is, as shown in FIG. 6, the screen sound producing device 400 comprises a substrate 110, a lower electrode 120, an ultrasonic generation unit array 1301, and an upper electrode 140. The ultrasonic generation unit array 1301 comprises a plurality of ultrasonic generation units 130 arranged in an array. The ultrasonic generation unit 130 may be an ultrasonic generation unit of the ultrasonic generator in any one of the foregoing embodiments, and therefore may have the same structure as the ultrasonic generation unit of a corresponding ultrasonic generator.

Figures 7A, 7B:
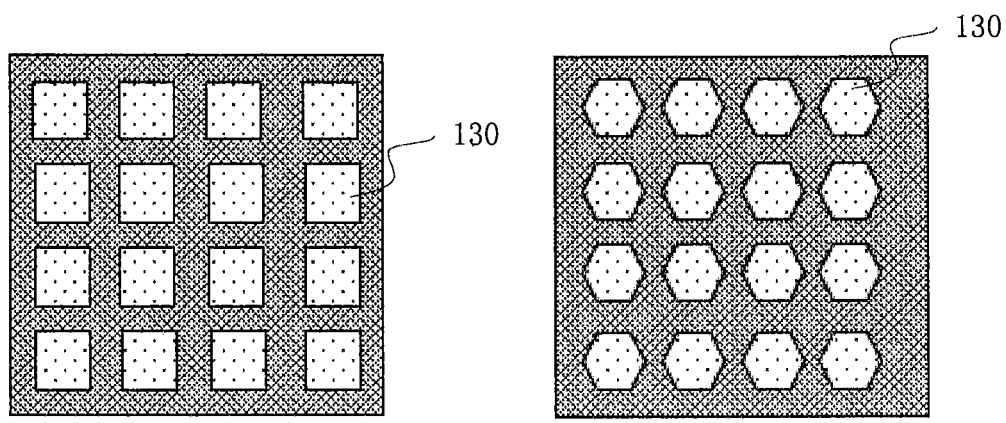
FIGS. 7A and 7B are schematic views illustrating an arrangement pattern of an array of ultrasonic generators according to an embodiment of the present disclosure.

The substrate 110 is used to provide support for the screen sound producing device 400. The lower electrode 120 is disposed on the upper surface of the substrate 110 and is configured to receive a first voltage that impels each ultrasonic generation unit 130 in the ultrasonic generation unit array 1301 to operate. The upper electrode 140 is disposed on the ultrasonic generation unit array 1301 and is configured to receive a second voltage that impels each ultrasonic generation unit 130 in the ultrasonic generation unit array 1301 to operate. The ultrasonic generation unit array 1301 is disposed between the lower electrode 120 and the upper electrode 140 and comprises a plurality of ultrasonic generation units 130 arranged according to a preset ultrasonic pattern. Under the control of the first voltage and the second voltage, the ultrasonic generation unit 130 emits ultrasonic waves having a frequency corresponding to the difference between the first voltage and the second voltage. The preset ultrasonic pattern refers to a pattern in which the ultrasonic generation units 130 are arranged. In order to synthesize sound waves that can be heard by the human ear at different spatial positions, the position of the ultrasonic generation unit 130 may be determined in advance according to the demand for sound production. By designing the arrangement pattern of the ultrasonic generation units 130 and controlling the operating frequency of each ultrasonic generation unit 130, rich sound field synthetic effects are finally achieved. In some embodiments, the vibration chambers 133 of the ultrasonic generation units 130 may be an array constituted by a plurality of parallel grooves, or a plurality of intersecting grooves (e.g., arranged in a matrix array). In some embodiments, these vibration chambers 133 are small array elements having a square shape/a circular shape/or other shapes arranged in any predefined pattern which are designed according to the demand for sound production. For example, in FIG. 7A, the vibration chambers of the ultrasonic generation units 130 are quadrangular; in FIG. 7B, the vibration chambers of the ultrasonic generation units 130 are hexagonal.

The screen sound producing device 400 may be assembled from discrete components, wherein the upper electrode 140 and the lower electrode 120 each employs a conductive material layer manufactured according to a predefined electrode pattern, and the ultrasonic generation unit array 1301 comprises a plurality of ultrasonic generators arranged according to a preset ultrasonic pattern. Alternatively, the ultrasonic generation unit array 1301 may be integrally manufactured on the substrate by an integrated manufacturing method.

In the screen sound producing device 400, the ultrasonic generation unit array 1301 controls the ultrasonic generation units 130 at different positions of the array to generate different ultrasonic components. After the ultrasonic components are synthesized, an acoustic wave signal that can be heard by the human ear is obtained. Specifically, an audio signal may be subjected to signal processing to obtain two (or multiple) channels of sub-signals, and the ultrasonic signals are modulated according to the sub-signals to obtain ultrasonic components with different frequencies. The modulated ultrasonic components are emitted into the air, and these ultrasonic components with different frequencies interact non-linearly in the air to be demodulated into audible sound (differential frequency waves). Although the audible sound is not directional, the audible sound carried on the ultrasonic wave can be controlled to have a specific emission direction, range and distance through the ultrasonic generator array combined with the phased array technology. Therefore, the screen sound producing device 400 can further achieve directional audio and private listening.

The ultrasonic generator according to an embodiment of the present disclosure may be integrated into a display panel.

In some embodiments, the display panel comprises a plurality of units arranged in an array, and each unit comprises a pixel unit of the display panel and the ultrasonic generator in any one of the foregoing embodiments. The display panel includes, but is not limited to, a liquid crystal display panel and an organic light emitting diode (OLED) display panel. Reference is made to an example of an organic light emitting diode display panel below.

Figure 8:
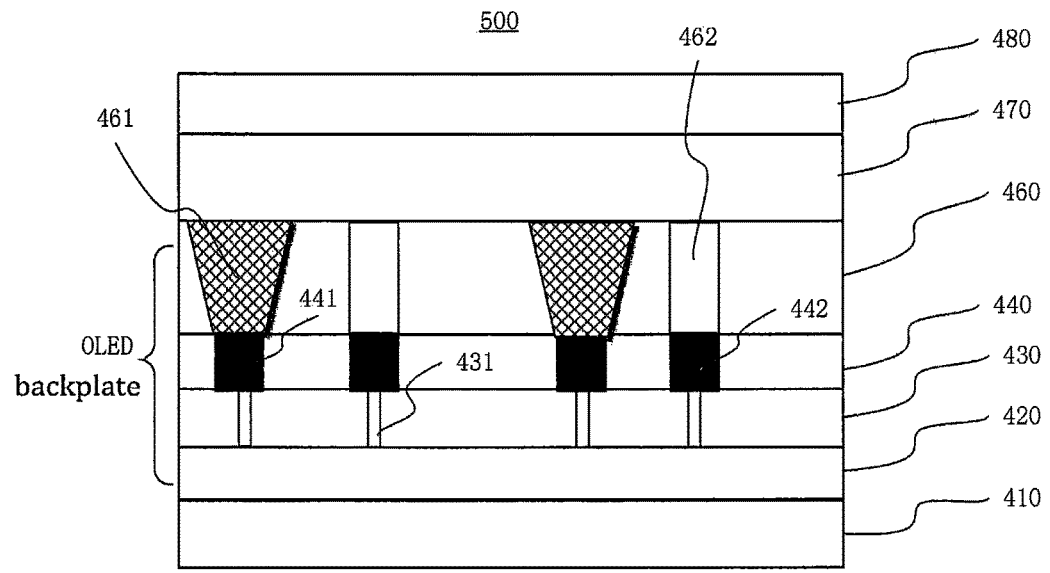
FIG. 8 is a schematic view illustrating a sectional structure of a display panel according to an embodiment of the present disclosure.
Figure 9:
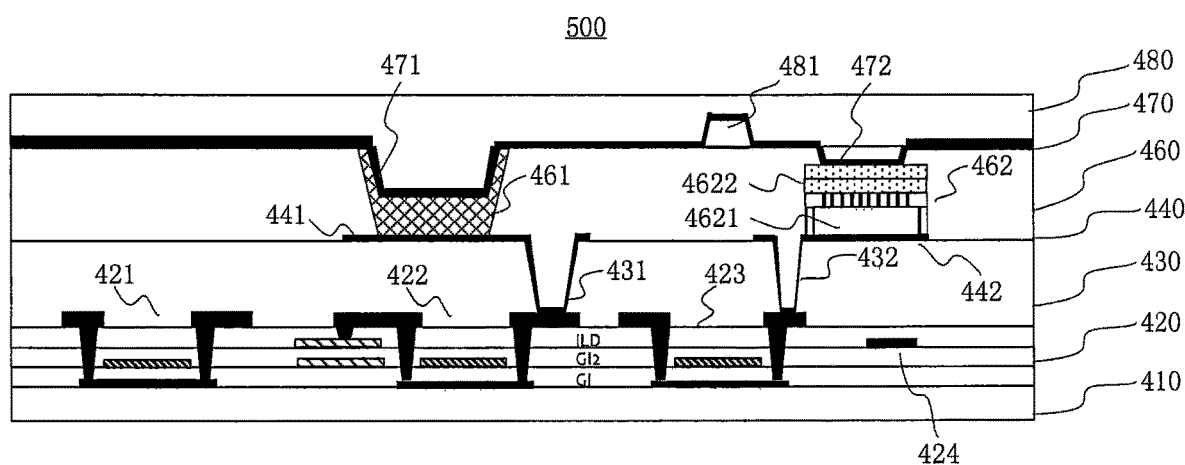
FIG. 9 is a schematic structural view of an integrated circuit of a display panel according to an embodiment of the present disclosure.

FIG. 8 is a schematic view illustrating a sectional structure of an organic light emitting diode display panel 500 according to an embodiment of the present disclosure, and FIG. 9 illustrates an integrated circuit structure in the organic light emitting diode display panel 500 in more detail.

As shown in FIGS. 8 and 9, the organic light emitting diode display panel 500 comprises a substrate 410, a driving circuit layer 420, a first insulating layer 430, a first electrode layer 440, a pixel design layer (PDL) 460, a second electrode layer 470, and a packaging layer 480 which are disposed from bottom to top sequentially.

The substrate 410 provides support for the organic light emitting diode display panel 500. In integrated manufacturing, the OLED display panel and the ultrasonic generator may share the same substrate, which further makes the product lighter and thinner. The substrate 410 may employ a substrate material of an OLED display panel commonly used in related technologies, such as glass, resin, and the like, which is not limited in this embodiment.

The driving circuit layer 420 comprises a pixel circuit of the OLED display panel and a driving circuit of the ultrasonic generator. In some embodiments, the driving circuit may comprise a plurality of thin film transistors (TFTs). By arranging the OLED pixel circuit and the ultrasonic generator at different positions in the display panel, and by designing the patterns of the OLED pixel circuit and the driving circuit of the ultrasonic generator, the pixel circuit of the OLED and the driving circuit of the ultrasonic generator can be reasonably arranged in the driving circuit layer 420.

Referring to FIG. 9, the OLED pixel circuit comprises a switching thin film transistor 421 and a first thin film transistor (i.e., a driving thin film transistor) 422, and the driving circuit of the ultrasonic generator comprises a second thin film transistor 423. A power line 424 transmits a supply voltage. The first thin film transistor 422 and the second thin film transistor 423 are disposed in the same layer. The driving circuit layer 420 further comprises sub-layers such as a gate insulating layer GI, a second gate insulating layer GI2, and an interlayer dielectric ILD. The sources, gates, and drains of the thin film transistors are electrically isolated by respective sub-layers.

The first insulating layer 430 is used to isolate the driving circuit layer 420 from the first electrode layer 440. As shown in FIG. 9, the first thin film transistor 422 is electrically connected to a first electrode 441 of the OLED through a first via hole 431 in the first insulating layer 430, and the second thin film transistor 423 is electrically connected to a lower electrode 442 of the ultrasonic generator through a second via hole 432 in the first insulating layer 430. In some embodiments, the via holes 431 and 432 are filled with a conductive material for connecting the OLED pixel circuit (specifically, the first thin film transistor 422) to the first electrode 441 of the OLED, and connecting the driving circuit of the ultrasonic generator (specifically, the second thin film transistor 423) to the lower electrode 442.

In the first electrode layer 440, the first electrode 441 of the OLED is arranged according to a preset first electrode pattern, and the lower electrode 442 of the ultrasonic generator is arranged according to a preset lower electrode pattern. The first electrode layer 440 may comprise a transparent electrode layer, such as an ITO (Indium Tin Oxide) electrode layer.

The pixel design layer (PDL) 460 comprises an organic light emitting layer 461 and ultrasonic generators 462 arranged according to a preset ultrasonic pattern. The PDL layer 460 may be formed of a resin material, and the organic light emitting layer 461 may be an electroluminescent layer arranged according to a preset pixel pattern. Each of the ultrasonic generators 462 comprises a vibration chamber 4621 and an ultrasonic generation layer 4622 disposed on the vibration chamber 4621. The vibration chamber 4621 is a cavity formed by etching a sacrificial layer. The ultrasonic generation layer 4622 propels the surrounding medium (such as air) to vibrate to generate ultrasonic waves under the effect of an operating voltage. The ultrasonic generator 462 may be disposed in a receiving hole, which is a hole punched in the pixel design layer 460 according to a preset ultrasonic pattern.

The second electrode layer 470 comprises a second electrode 471 of the OLED and an upper electrode 472 of the ultrasonic generator arranged according to a preset upper electrode pattern. In an example, the second electrode 471 may cover the organic light emitting layer 461 and the ultrasonic generator 462. In this case, the second electrode 471 also serves as an upper electrode of the ultrasonic generator 462. In another example, the second electrode 471 and the upper electrode 472 of the ultrasonic generator 462 are independent of each other. The second electrode layer 470 may be an ITO (Indium Tin Oxide) electrode layer.

The packaging layer 480 is a thin film encapsulation layer (TFE) for packaging the organic light emitting diode display panel. Since the TFE is very thin, the ultrasonic generator 462 is close to the upper surface of the display panel 500, so that the energy of ultrasonic waves can be retained to the greatest extent.

In some embodiments, the first electrode 441 may be an anode, and the second electrode 471 may be a cathode. Alternatively, the first electrode 441 may also be a cathode, and the second electrode 471 may also be an anode. One of the first electrode 441 and the second electrode 471 may be patterned into a block electrode corresponding to the organic light emitting layer 461, and the other may be a planar electrode. It is also possible to pattern both of the electrodes.

The ultrasonic generator 462 may be a capacitive ultrasonic generator or a piezoelectric ultrasonic generator. In the example of FIG. 9, the ultrasonic generator 462 is in a structural form similar to the piezoelectric ultrasonic generator 100B shown in FIG. 2. Of course, the ultrasonic generator 462 may also be replaced with a capacitive ultrasonic generator. In this embodiment, the pixel design layer 460 functions as the substrate of the ultrasonic generator 462.

In an embodiment in which the ultrasonic generator 462 is a capacitive ultrasonic generator, the ultrasonic generation layer 4622 is displaced and oscillated under the effect of an alternating voltage, thereby propelling the surrounding medium to vibrate to generate ultrasonic waves. The sacrificial layer portion of the ultrasonic generator 462 may be implemented by a silicon dioxide layer deposited in the receiving hole, and the vibration chamber 4621 may be implemented by a groove formed by etching the silicon dioxide layer. The ultrasonic generation layer 4622 comprises a silicon nitride layer and a porous silicon layer which are deposited sequentially on the silicon dioxide layer from bottom to top. The silicon nitride layer and the porous silicon layer are auxiliary layers used in the etching process for the silicon dioxide layer, which will be used as vibrating film layers after etching is finished to realize reuse of functions.

In an embodiment in which the ultrasonic generator 462 is a piezoelectric ultrasonic generator, the ultrasonic generation layer 4622 is deformed under the effect of a pulse voltage, thereby propelling the surrounding medium to vibrate to generate ultrasonic waves. The sacrificial layer of the ultrasonic generator 462 may also be implemented by a silicon dioxide layer deposited in the receiving hole, and the vibration chamber 4621 may be implemented by a groove formed by etching the silicon dioxide layer. The ultrasonic generation layer 4622 comprises a silicon nitride layer, a porous silicon layer, and a piezoelectric film layer which are deposited sequentially on the silicon dioxide layer from bottom to top. The silicon nitride layer and the porous silicon layer are auxiliary layers used in the etching process for the silicon dioxide layer, which will constitute the ultrasonic generation layer with a piezoelectric film layer after etching is finished to realize reuse of functions.

In order to simplify the process, in some embodiments, the sacrificial layer may also be implemented by the pixel design layer 460, the vibration chamber 4621 is implemented by a groove formed by directly etching the resin of the pixel design layer 460, and the ultrasonic generation layer 4622 comprises a piezoelectric film layer disposed on the vibration chamber 4621.

In the display panel 500 according to the embodiment of the present disclosure, the ultrasonic generator having a pixel-level size may be effectively integrated into each pixel unit of the display panel, thereby reducing space occupied by the ultrasonic generator. This makes it easier to manufacture lighter, thinner devices that integrate the sound production function with the display function, such as televisions, displays, and the like. Moreover, by using ultrasonic phase control technology, not only conventional sound production can be achieved, but also effects such as directional sound production, surround sound production, and the like can also be achieved.

Figure 10:
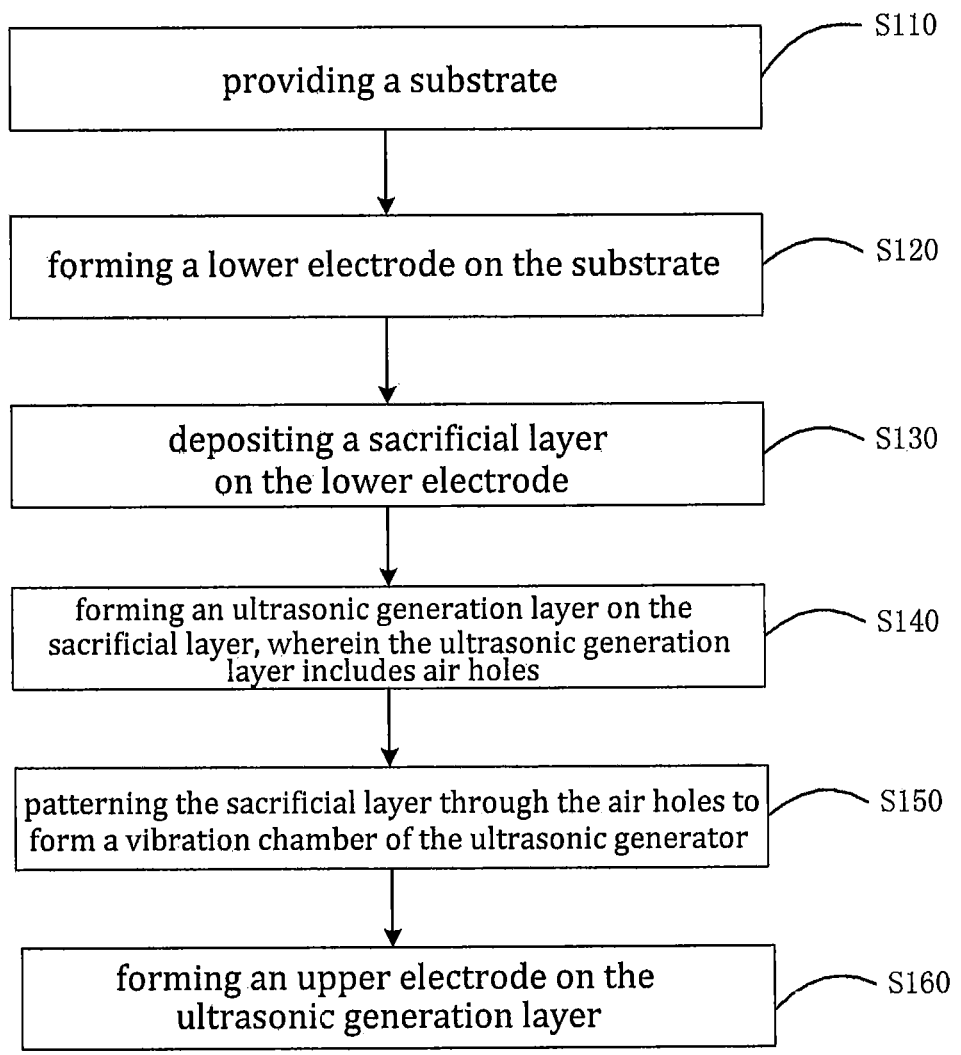
FIG. 10 is a flow chart of a method of manufacturing an ultrasonic generator according to an embodiment of the present disclosure.

FIG. 10 is a flow chart of a method of manufacturing an ultrasonic generator according to an embodiment of the present disclosure. The manufacturing method is described below with reference to FIGS. 1, 2 and 10.

S110, providing a substrate 110.

S120, forming a lower electrode 120 on the substrate 110.

S130, depositing a sacrificial layer on the lower electrode 120.

S140, forming an ultrasonic generation layer 132 on the sacrificial layer, wherein the ultrasonic generation layer 132 includes air holes.

S150, patterning the sacrificial layer through the air holes to form a vibration chamber 133 of the ultrasonic generator.

S160, forming an upper electrode 140 on the ultrasonic generation layer 132.

The lower electrode 120 formed in step S120 may be polysilicon, and may also be a metal conductor material such as aluminum or copper.

In step S140, forming an ultrasonic generation layer 132 on the sacrificial layer may comprise the following sub-steps: depositing a silicon nitride layer 14 on the sacrificial layer (for example, a silicon dioxide layer), and etching the silicon nitride layer 14 to form a silicon nitride layer 14 including a plurality of etched holes; and forming a porous silicon layer 15 on the silicon nitride layer 14. The etched holes in the silicon nitride layer 14 are used to introduce a reagent (for example, hydrogen fluoride) in subsequent steps so as to etch the sacrificial layer. The diameter of the etched hole may be between 1 μm and 3 μm. The air holes in the porous silicon layer 15 are also used to introduce a reagent (for example, hydrogen fluoride) in subsequent steps so as to etch the sacrificial layer.

In step S150, patterning the sacrificial layer through the air holes may comprise the following sub-steps: adding a reagent to the sacrificial layer through the air holes to etch the sacrificial layer. At that time, the air holes refer to the etched holes in the silicon nitride layer 14 and the air holes in the porous silicon layer 15. For example, a hydrofluoric acid reagent may be injected into the sacrificial layer through the etched holes in the silicon nitride layer 14 and the air holes in the porous silicon layer 15, and the sacrificial layer is etched by the hydrofluoric acid reagent to form the vibration chamber 133 of the ultrasonic generator. In order to reduce the resistance to motion of the ultrasonic generation layer 132, the vibration chamber 133 may be a vacuum chamber or a near-vacuum chamber. Alternatively, in an example, patterning the sacrificial layer through the air holes may comprise: irradiating the sacrificial layer with light of an appropriate wavelength through the etched holes in the silicon nitride layer 14 and the air holes in the porous silicon layer 15, so that the sacrificial layer is etched into a desired shape to form the vibration chamber 133 of the ultrasonic generator. In this case, the sacrificial layer may comprise a photosensitive material.

The silicon nitride layer 14 and the porous silicon layer 15 may serve as vibrating film layers of a capacitive ultrasonic generator to realize reuse of functions. The choices of the thickness and the material of the vibrating film layer determine the transmission frequency of the ultrasonic generator. By changing the driving voltage, the ultrasonic generator may be controlled to emit ultrasonic waves with different frequencies. For example, by designing the film thicknesses of the silicon nitride layer 14 and the porous silicon layer 15 to an appropriate value, the optimal transmission frequency of the ultrasonic generator can be obtained.

Of course, a piezoelectric ultrasonic generator may also be formed by a similar manufacturing method. For this purpose, in addition to the steps S110 to S160 described above, the manufacturing method further comprises forming a piezoelectric film layer 16 on the porous silicon layer 15 between steps S150 and S160. The piezoelectric film layer 16 is deformed under the effect of a pulse voltage and generates ultrasonic waves. The operating principles of the capacitive ultrasonic generator and the piezoelectric ultrasonic generator have been described above in the embodiments regarding the ultrasonic generator, and will not be repeated here.

In the manufacturing method provided by this embodiment, the ultrasonic generator is formed by integrally manufacturing various film layers on a substrate, so that the structure of the ultrasonic generator is more compact. Through high-precision integrated manufacturing, the size of the ultrasonic generator can be at pixel level or quasi-pixel level, so that a sound producing device comprising the ultrasonic generator array can achieve precise, directional sound production under the control of the ultrasonic phased array. In addition, the above manufacturing method may also be merged into the manufacturing process of the display panel, so that the sound producing device and the display device are manufactured at one time. This can simplify the overall process flow and save the cost.

Figure 11:
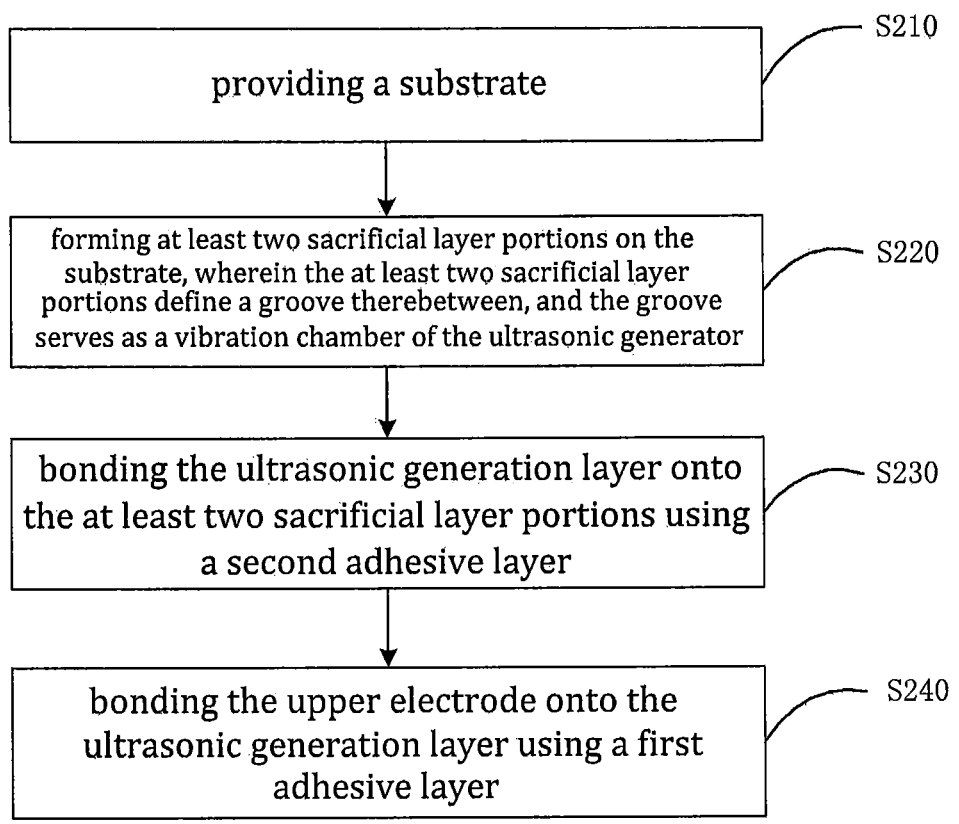
FIG. 11 is a flow chart of a method of manufacturing an ultrasonic generator according to an embodiment of the present disclosure.

FIG. 11 is a flow chart of a method of manufacturing an ultrasonic generator according to another embodiment of the present disclosure. The manufacturing method will be described below with reference to FIG. 11 and FIGS. 4A-4B and 5A-5B.

S210, providing a substrate 110.

S220, forming at least two sacrificial layer portions 131 on the substrate 110, wherein the at least two sacrificial layer portions 131 define a groove therebetween, and the groove serves as a vibration chamber 133 of the ultrasonic generator.

S230, bonding the ultrasonic generation layer 132 onto the at least two sacrificial layer portions 131 using a second adhesive layer 152.

S240, bonding the upper electrode 140 onto the ultrasonic generation layer 132 using a first adhesive layer 151.

In step S220, forming at least two sacrificial layer portions 131 on the substrate 110 may comprise the following sub-steps: etching a side of the substrate 110 close to the ultrasonic generation layer 132 to form the at least two sacrificial layer portions 131. At that time, prior to step S230, the lower electrode 120 is bonded to the bottom of the groove. The lower electrode pattern may be predefined according to the shape of the formed groove. For example, a lower electrode 120 having a predefined pattern matching the shape of the groove may be fabricated and then adhered to the bottom of the groove as a whole. During the operation of the formed ultrasonic generator, the upper electrode 140 and the lower electrode 120 are configured to provide an operating voltage to the ultrasonic generation layer of the ultrasonic generator.

In some embodiments, the sacrificial layer portion 131 is obtained by etching a part of the substrate 110. Therefore, the sacrificial layer portions 131 and the substrate 110 are integrally formed and made of the same material. For example, during the manufacturing process, the substrate 110 may be patterned according to design requirements to obtain desired sacrificial layer portions 131 and a groove between sacrificial layer portions 131 on the substrate, and the groove serves as a vibration chamber 133 of the ultrasonic generator. A part of the substrate 110 is etched to form the sacrificial layer portions 131, which can eliminate the need to deposit an additional film layer, thereby reducing process steps and saving the cost.

In an alternative embodiment, in step S220, forming at least two sacrificial layer portions 131 on the substrate 110 may comprise the following sub-steps: depositing a metal layer on the substrate 110, and etching the metal layer to form the at least two sacrificial layer portions 131. The at least two sacrificial layer portions 131 serve as the lower electrode 120.

In this case, the sacrificial layer portion 131 is formed independently of the substrate 110. The metal layer deposited on the substrate 110 is patterned to obtain a desired sacrificial layer portions 131 and a groove between sacrificial layer portions 131, the groove serves as a vibration chamber 133 of the ultrasonic generator. Since the sacrificial layer portion 131 is formed of a metal material, the sacrificial layer portion 131 may also serve as the lower electrode 120. In this way, the need to deposit an additional conductive film layer can be eliminated, which can reduce process steps and save the cost. During the operation of the formed ultrasonic generator, the upper electrode 140 and the lower electrode 120 are configured to provide an operating voltage to the ultrasonic generation layer of the ultrasonic generator.

In steps S230 and S240, the first adhesive layer 151 may be a conductive adhesive layer, and the second adhesive layer 152 includes, but is not limited to, an insulating adhesive layer. By using an adhesive layer bonding method, the ultrasonic generation layer 132 is adhered onto the sacrificial layer portion 131, and then the upper electrode 140 is adhered onto the ultrasonic generation layer 132. Alternatively, when the ultrasonic generation layer 132 is being manufactured, it is also possible to additionally form an upper electrode 140 on the ultrasonic generation layer 132. The upper electrode 140 may be an entire plane comprising a conductive material, and the conductive material includes, but is not limited to, Al, Cu, Ag, ITO, and the like. By using the adhesive layer bonding method, a discrete manufacturing process can be realized. That is, during the manufacturing process, the vibration chamber 133 may be formed first, and then the ultrasonic generation layer 132 and the upper electrode 140 may be bonded independently.

The ultrasonic generator may be formed into a capacitive ultrasonic generator or a piezoelectric ultrasonic generator. As described above, in an embodiment in which the ultrasonic generator is a capacitive ultrasonic generator, the ultrasonic generation layer 132 may comprise vibrating film layers such as a silicon nitride layer 14 and a porous silicon layer 15. In an embodiment in which the ultrasonic generator is a piezoelectric ultrasonic generator, the ultrasonic generation layer 132 may comprise a silicon nitride layer 14, a porous silicon layer 15, and a piezoelectric film layer 16. The piezoelectric film layer 16 includes, but is not limited to, materials such as PVDF, PET, etc. During the process of manufacturing the ultrasonic generator, each of the film layers included in the ultrasonic generation layer 132 may be independently formed, and then the formed ultrasonic generation layer 132 is bonded onto the sacrificial layer portion 131. During the operation of the ultrasonic generator, the ultrasonic generation layer 132 is configured to propel the surrounding medium to vibrate to generate ultrasonic waves under an operating voltage.

In order to achieve a better display effect when integrated with a display, the substrate 110, the upper electrode 140, the lower electrode 120, and the ultrasonic generation layer 132 may all be made of transparent materials. For example, the substrate 110 may be made of glass or other transparent plastics, resins or the like. The upper electrode 140 and the lower electrode 120 may employ transparent electrodes. In this way, the ultrasonic generator can be set on the light exit side of a display screen without affecting display. At the same time, since it is set on the light exit side, ultrasonic waves emitted by the ultrasonic generator are less affected by other structures, so that it is easier to control the sound field. Of course, as an optional implementation, the ultrasonic generator may also be manufactured into an opaque structure for use in scenarios other than integration with a display. In some embodiments, the ultrasonic generator may also be set on the non-light exit side of a display screen.

In the manufacturing method provided by the embodiment of the present disclosure, by using an adhesive layer bonding method, the vibration chamber 133 is formed first, and then the ultrasonic generation layer 132 and the upper electrode 140 are independently bonded, so that various parts of the ultrasonic generator can be manufactured discretely. The discrete manufacturing process is relatively simple and controllable, which helps to improve the production yield and reduce the production cost.

Figure 12:
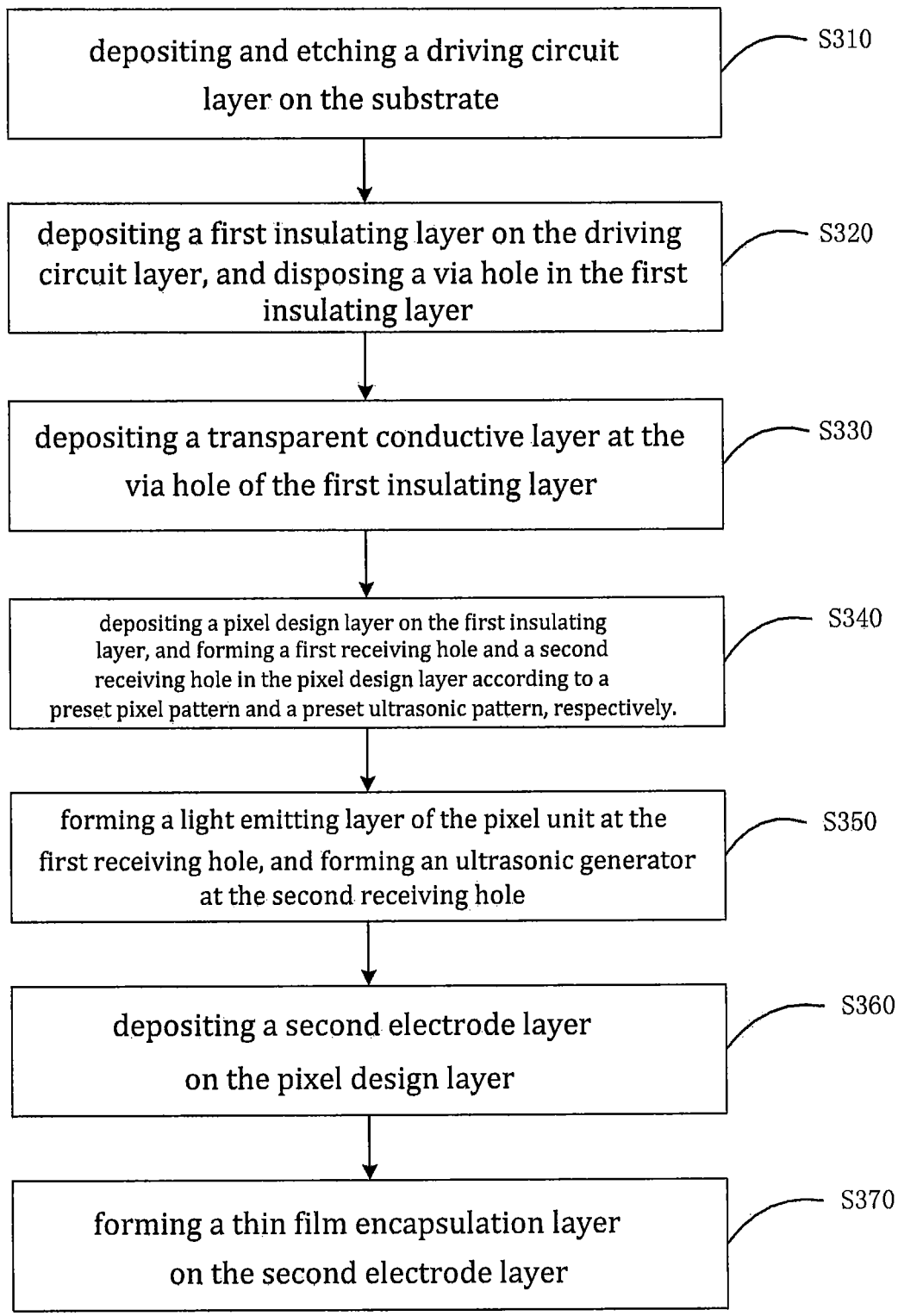
FIG. 12 is a flow chart of a method of manufacturing a display panel according to an embodiment of the present disclosure.

FIG. 12 is a flow chart of an integrated manufacturing method of an organic light emitting diode display panel according to an embodiment of the present disclosure. This method is used for manufacturing the organic light emitting diode display panel shown in FIGS. 8 and 9.

S310: depositing and etching a driving circuit layer on the substrate, wherein the driving circuit layer comprises an OLED pixel circuit and a driving circuit of the ultrasonic generator.

S320: depositing a first insulating layer on the driving circuit layer, and disposing a via hole in the first insulating layer, wherein the position of the via hole is determined according to a preset first electrode pattern and a preset lower electrode pattern, and the first insulating layer may be made of an insulating material such as resin.

S330: depositing a transparent conductive layer such as a conductive layer of indium tin oxide, at the via hole of the first insulating layer, for connecting the OLED pixel circuit to a first electrode of the OLED, and connecting the driving circuit of the ultrasonic generator to the lower electrode.

S340: depositing a pixel design layer (PDL) on the first insulating layer, and forming a first receiving hole and a second receiving hole in the pixel design layer according to a preset pixel pattern and a preset ultrasonic pattern, respectively, wherein the pixel design layer may be an insulating resin layer.

S350: evaporating a light emitting material such as an electroluminescent (EL) material at the first receiving hole to form a light emitting layer of the pixel unit, and forming an ultrasonic generator at the second receiving hole. For the manufacturing method of the ultrasonic generator, reference may be made to the description of the foregoing embodiments, and details are not described here again.

S360: depositing a second electrode layer on the pixel design layer, wherein the second electrode layer comprises a second electrode of the OLED arranged according to a preset second electrode pattern and an upper electrode of an ultrasonic generator arranged according to a preset upper electrode pattern. In some embodiments, the ultrasonic generator may share the second electrode as an upper electrode. In this case, the upper electrode of the ultrasonic generator may be a planar electrode. In an alternative embodiment, an upper electrode pattern corresponding to the ultrasonic generator may also be designed, and an upper electrode is manufactured according to the upper electrode pattern.

S370: forming a thin film encapsulation layer on the second electrode layer to package the display panel.

By using an FPD (Flat Panel Display) glass-based process to fabricate a micro-machined ultrasonic generator and its driving circuit on the OLED backplate, the sizes of the ultrasonic generator and the driving circuit can be greatly reduced. Moreover, by using ultrasonic carrier waves and phased array technology to realize screen sound production and audio directional emission, it is possible to achieve sound directional adjustment and increase the sound pressure intensity. At the same time, the integration of a speaker with a display can also be achieved, which solves the problem that the speaker can be placed nowhere.

Figure 13:
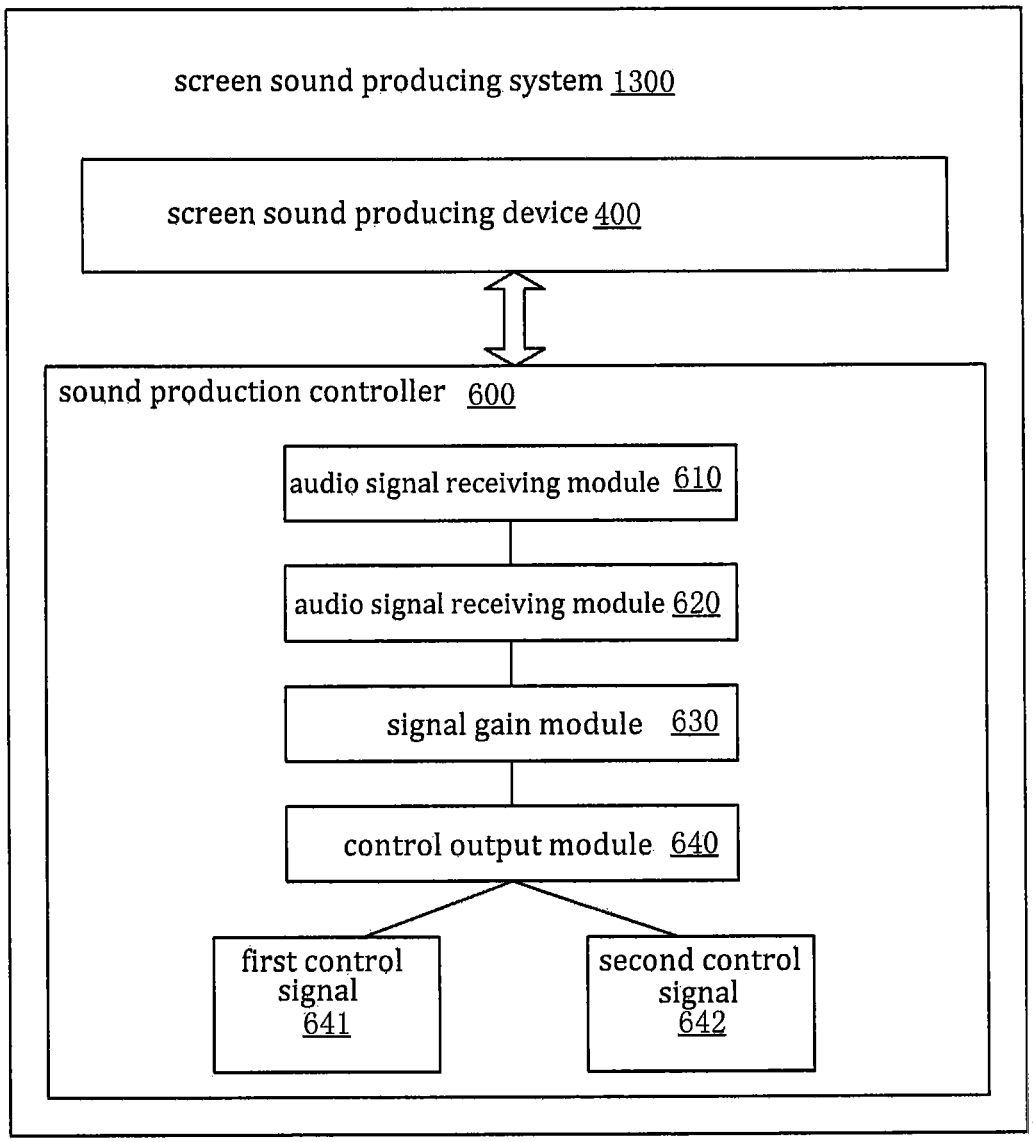
FIG. 13 is a schematic block diagram of a screen sound producing system according to an embodiment of the present disclosure.

FIG. 13 is a schematic block diagram of a screen sound producing system 1300 according to an embodiment of the present disclosure.

Referring to FIG. 13, the screen sound producing system 1300 comprises a screen sound producing device 400 and a sound production controller 600. The screen sound producing device 400 may be the screen sound producing device described above with reference to FIG. 6. The sound production controller 600 is configured to control the screen sound producing device 400 to produce sound according to an input audio signal. Specifically, the sound production controller 600 may comprise: an audio signal receiving module 210, a signal modulation module 620, a signal gain module 630, and a control output module 640.

The audio signal receiving module 610 is configured to receive an audio signal. For example, in a device (such as a television) integrated with display and sound production functions, a sound signal synchronized with the image is received.

The signal modulation module 620 is configured to generate an ultrasonic control signal of the ultrasonic generation unit array according to a received audio signal.

The ultrasonic frequency is much higher than the audible frequency range of the human ear. Two (or multiple) channels of ultrasonic signals with different frequencies need to be synthesized so that the frequency of a synthesized signal is within the hearing range of the human ear. Therefore, the audio signal needs to be modulated. In some embodiments, all of the ultrasonic generation units in the ultrasonic generation array may be divided into two groups, each group being controlled by a corresponding channel of ultrasonic control signals. In operation, the two groups of ultrasonic generation units are used to emit a first ultrasonic signal and a second ultrasonic signal, respectively, wherein the differential frequency between the first ultrasonic signal and the second ultrasonic signal is the baseband frequency of the audio signal. For example, the first ultrasonic signal is an ultrasonic carrier wave having a carrier frequency, and the second ultrasonic signal has a frequency that is the difference between the carrier frequency and the baseband frequency of the audio signal. The audio signal may be modulated on the first and second ultrasonic signals.

The process of demodulating into audible sound is related to various factors such as the position of the ultrasonic generation unit, the frequency, phase and direction of the ultrasonic signal, and the like. In practice, the ultrasonic phased array technology can be used to control the generation of ultrasonic signals. The ultrasonic phased array technology is an electrical scanning method that can change the ultrasonic emission direction without the need for mechanical rotation. Specifically, each array element in the ultrasonic array is controlled by an electronic system to emit ultrasonic waves according to a certain delay time rule, thereby controlling deflection and focusing of the ultrasonic sound beams to obtain a directional sound beam.

Since the ultrasonic generator and its driving circuit can be implemented at pixel level, the granularity of the ultrasonic phase control can theoretically be designed to be at the pixel level. This allows generation of a very fine sound field distribution. The control accuracy of the ultrasonic phase control can be designed as needed, which is not limited to an embodiment in which two groups of ultrasonic generation units are used.

The signal gain module 630 is configured to perform power amplification and impedance matching on the ultrasonic control signal to generate a voltage control signal.

The control output module 640 is configured to control a voltage difference between the upper electrode and the lower electrode of the ultrasonic generator array according to the voltage control signal, thereby controlling output of the ultrasonic generator array. For example, in an embodiment in which two groups of ultrasonic generation units are used, the control output module 640 may output a first control signal 641 supplied to the first group of ultrasonic generation units and a second control signal 642 supplied to the second group of ultrasonic generation units.

The sound production controller 600 may be implemented using a general purpose processor, a digital signal processor (DSP), an application specific integrated circuit (ASIC), a field programmable gate array (FPGA) or other programmable logic device, discrete gate or transistor logic, discrete hardware components, or any suitable combination thereof designed to perform the functions described herein. The general purpose processor may be a microprocessor, but in an alternative scheme, the processor may be a conventional processor, a controller, a microcontroller, or a state machine. The processor may also be implemented as a combination of computing devices, for example, a combination of a DSP and a microprocessor, a plurality of microprocessors, one or more microprocessors in conjunction with a DSP core, or any other such configuration.

The screen sound producing system 1300 has the same advantages as the screen sound producing device 400, which will not be repeated here.

In the description of this specification, the description with reference to the terms "an embodiment", "some embodiments", "example", "specific examples", "some examples", and the like means that specific features, structures, materials or characteristics described in conjunction with the embodiments or examples are included in at least one embodiment or example of the present disclosure. In this specification, references to the above terms are not necessarily directed to the same embodiment or example. Moreover, the specific features, structures, materials, or characteristics described may be combined in any suitable manner in any one or more embodiments or examples. In addition, without causing any contradiction, those skilled in the art may combine different embodiments or examples and features of the different embodiments or examples described in this specification.

Although the embodiments of the present disclosure have been illustrated and described above, it can be understood that the above-described embodiments are exemplary and should not be construed as limiting the present disclosure. A person having an ordinary skill in the art can make changes, modifications, replacements and variations to the above-described embodiments within the scope of the present disclosure.

The invention claimed is:

1. An ultrasonic generator comprising:
    a substrate;
    a lower electrode on the substrate;
    an upper electrode on the lower electrode; and
    an ultrasonic generation unit between the lower electrode and the upper electrode,
    wherein the ultrasonic generation unit comprises a vibration chamber and an ultrasonic generation layer on the vibration chamber, and
    wherein the ultrasonic generation layer is configured to propel a surrounding medium to vibrate to generate ultrasonic waves in response to a voltage difference between the upper electrode and the lower electrode,
    wherein the ultrasonic generation unit is selected from the group consisting of a capacitive ultrasonic generation unit and a piezoelectric ultrasonic generation unit,
    wherein the ultrasonic generation layer of the capacitive ultrasonic generation unit comprises:
        a silicon nitride layer comprising a plurality of etched holes; and
        a porous silicon layer between the silicon nitride layer and the upper electrode,
    wherein the ultrasonic generation layer of the piezoelectric ultrasonic generation unit comprises:
        a silicon nitride layer comprising a plurality of etched holes;
        a porous silicon layer on the silicon nitride layer; and
        a piezoelectric film layer between the porous silicon layer and the upper electrode.

2. The ultrasonic generator according to claim 1, further comprising:
    at least two sacrificial layer portions between the lower electrode and the ultrasonic generation layer,
    wherein the at least two sacrificial layer portions define a groove therebetween, and
    wherein the groove serves as the vibration chamber.

3. The ultrasonic generator according to claim 1, further comprising:
    a first adhesive layer between the ultrasonic generation layer and the upper electrode;
    at least two sacrificial layer portions between the substrate and the ultrasonic generation layer; and
    one or more second adhesive layers, a respective one of the second adhesive layers being between a respective one of the at least two sacrificial layer portions and the ultrasonic generation layer,
    wherein the at least two sacrificial layer portions define a groove therebetween, and the groove serves as the vibration chamber.

4. The ultrasonic generator according to claim 3, wherein the sacrificial layer portions and the substrate are integrally formed and made of a same material.

5. The ultrasonic generator according to claim 4, wherein the lower electrode is bonded to a bottom of the groove.

6. The ultrasonic generator according to claim 3, wherein the sacrificial layer portions comprise a metal material and functions as the lower electrode.

7. A display panel comprising a plurality of units arranged in an array, wherein each unit comprises a pixel unit and the ultrasonic generator according to claim 1.

8. The display panel according to claim 7,
    wherein the display panel comprises an organic light emitting diode display panel, and
    wherein each unit further comprises:
        a first transistor;
        a second transistor, which is in a same layer as the first transistor; and
        a first electrode of an organic light emitting diode, which is on the first transistor and electrically connected to the first transistor,
    wherein the ultrasonic generator is on the second transistor, and a lower electrode of the ultrasonic generator is electrically connected to the second transistor.

9. The display panel according to claim 8, wherein each unit further comprises:
    an organic light emitting layer of the organic light emitting diode, wherein the organic light emitting layer is on the first electrode; and
    a second electrode of the organic light emitting diode, which overlaps the organic light emitting layer and the ultrasonic generator,
    wherein the second electrode functions as an upper electrode of the ultrasonic generator.

10. A screen sound producing system, comprising:
    a screen sound producing device comprising a plurality of ultrasonic generators according to claim 1 arranged in an array; and
    a sound production controller configured to control the screen sound producing device to produce sound according to an input audio signal.

* * * * *